United States Patent
Akiyama et al.

(10) Patent No.: US 6,680,260 B2
(45) Date of Patent: Jan. 20, 2004

(54) METHOD OF PRODUCING A BONDED WAFER AND THE BONDED WAFER

(75) Inventors: Shoji Akiyama, Gunma (JP); Masaro Tamatsuka, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/244,412

(22) Filed: Sep. 17, 2002

(65) Prior Publication Data

US 2003/0020096 A1 Jan. 30, 2003

Related U.S. Application Data

(62) Division of application No. 09/830,389, filed on Apr. 26, 2001, now Pat. No. 6,492,682.

(30) Foreign Application Priority Data

Aug. 27, 1999 (JP) .............................. 11-240946
Feb. 22, 2000 (JP) .......................... 2000-43764

(51) Int. Cl.⁷ ............................................... H01L 21/31
(52) U.S. Cl. .......................................... 438/766; 117/2
(58) Field of Search ....................... 438/480, 510–511, 438/519, 787–788, 766, 795, 423, 455, 475, 514; 117/2–3, 89

(56) References Cited

U.S. PATENT DOCUMENTS

| 5,331,193 A |   | 7/1994  | Mukogawa |       |
|-------------|---|---------|----------|-------|
| 5,931,662 A | * | 8/1999  | Adachi et al. | 432/6 |
| 5,994,761 A | * | 11/1999 | Falster et al. | 257/611 |

(List continued on next page.)

FOREIGN PATENT DOCUMENTS

| JP | A 1-259539  | 10/1989 |   |           |
| JP | A 4-294540  | 10/1992 |   |           |
| JP | A 5-299413  | 11/1993 |   |           |
| JP | A 7-14827   | 1/1995  |   |           |
| JP | A 9-252100  | 9/1997  |   |           |
| JP | A 10-84101  | 3/1998  |   |           |
| JP | A 10-98047  | 4/1998  |   |           |
| JP | A 10-98171  | 4/1998  |   |           |
| JP | A 11-135511 | 5/1999  |   |           |
| JP | A 11-191617 | 7/1999  |   |           |
| JP | WO00/12786  | * | 3/2000 | ........... C30B/29/06 |

OTHER PUBLICATIONS

K. Mitani, "Smart Cut (R) SOI Gijutsu no Shinchoku to Doukou", Chou LSI Ultra Clean Technology Symposium, vol. 33 (Japan), UCS Handoutai kiban Gijutsu Kekyukai, May 27, 1999 pp. 119–126.

T. Abe et al., "Dynamic Behavior of Intrinsic Point Defects in FZ and CZ Silicon Crystals", Mat. Res. Soc. Symp. Proc. vol. 262, 1992, Materials Research Society.

*Primary Examiner*—David Nelms
*Assistant Examiner*—David Vu
(74) *Attorney, Agent, or Firm*—Oliff & Berridge, PLC (57) ABSTRACT

There is provided a method of producing a bonded SOI wafer wherein a silicon single crystal ingot is grown according to Czochralski method, the single crystal ingot is then sliced to produce a silicon single crystal wafer, the silicon single crystal wafer is subjected to heat treatment in a non-oxidizing atmosphere at a temperature of 1100° C. to 1300° C. for one minute or more and continuously to a heat treatment in an oxidizing atmosphere at a temperature of 700° C. to 1300° C. for one minute or more without cooling the wafer to a temperature less than 700° C. to provide a silicon single crystal wafer wherein a silicon oxide film is formed on the surface, and the resultant wafer is used as the bond wafer, and a bonded SOI wafer produced by the method. There can be provided a SOI wafer that has a SOI layer having few crystal defects, good surface roughness and high quality in high productivity, in high yield and with low cost.

28 Claims, 8 Drawing Sheets

U.S. PATENT DOCUMENTS

| | | |
|---|---|---|
| 6,129,787 A | 10/2000 | Adachi et al. |
| 6,146,911 A | 11/2000 | Tsuchiya et al. |
| 6,162,708 A | 12/2000 | Tamatsuka et al. |
| 6,180,497 B1 | 1/2001 | Sato et al. |
| 6,224,668 B1 | 5/2001 | Tamatsuka |
| 6,245,311 B1 | 6/2001 | Kobayashi et al. |
| 6,258,613 B1 | 7/2001 | Iwamatsu |
| 6,284,629 B1 | 9/2001 | Yokokawa et al. |
| 6,313,014 B1 | 11/2001 | Sakaguchi et al. |
| 6,350,703 B1 * | 2/2002 | Sakaguchi et al. .......... 438/766 |
| 6,376,395 B2 | 4/2002 | Vasat et al. |
| 6,413,310 B1 * | 7/2002 | Tamatsuka et al. ............ 117/3 |

* cited by examiner

METHOD OF PRODUCING A BONDED WAFER AND THE BONDED WAFER

This is a Division of application Ser. No. 09/830,389 filed Apr. 26, 2001 U.S. Pat. No. 6,492,682. The entire disclosure of the prior application is hereby incorporated by reference herein in its entirety.

TECHNICAL FIELD

The present invention relates to a method of producing a bonded wafer having very few crystal defects on and near the surface and a bonded SOI wafer.

BACKGROUND ART

SOI (silicon on insulator) has a buried oxide film (BOX: Buried OXide) as a insulator film right below a silicon layer that is to be a region for fabrication of device, and is expected to be a silicon material for high speed device with electric power saving performance. One of methods for producing a SOI wafer is a bonding method wherein two silicon single crystal wafers, one of which is to be a bond wafer (a substrate that is to be a SOI layer on which a device is fabricated), and the other of which is to be a base wafer (a substrate supporting the SOI layer) are bonded via a oxide film, and then thickness of the bond wafer is decreased to form a SOI structure. The method has an advantage that crystallinity of the SOI layer is excellent, and insulating property of BOX is high, but has a disadvantage that quality of the SOI layer is influenced much by quality of the bond wafer.

Specifically, it has been known that there exist micro crystal defects (Grown-in defects) such as COP (Crystal Originated Particles) that is a void type defect or the like in a silicon wafer produced according to Czochralski method, which adversely affects characteristics of the device such as oxide dielectric breakdown voltage. In order to solve the problem, there have been known that visible defects can be reduced by using, as a substrate for a bond wafer, a wafer wherein a CZ wafer is subjected to annealing in a hydrogen atmosphere or an epitaxial wafer wherein an epitaxial layer is formed on a CZ wafer (See Japanese Patent Application Laid-open (kokai) No. 9-22993 and Japanese Patent Application Laid-open (kokai) No. 9-260619).

However, two heat treatments, namely heat treatment such as hydrogen annealing or epitaxial growth and heat treatment for forming a buried oxide film, which may lead to increase of cost and lowering of through put.

In the case of the epitaxial wafer, haze (surface roughness) is generated on the surface of the epitaxial layer, or projection called mound is sometimes formed. They may cause bonding failure when the wafers are bonded. Accordingly, it is sometimes necessary to polish the surface of the epitaxial layer before bonding in that case.

On the other hand, crystal defects are reduced by hydrogen annealing only at layer quite near the surface (about 0.5 $\mu$m from the surface), and thus, if a SOI wafer having a thickness more than the value is produced, an area where crystal defects are not reduced is exposed. Therefore, crystal defects in the whole SOI layer cannot be reduced, unless any measures are taken, for example, further hydrogen annealing is conducted after SOI wafer is produced. Furthermore, according to annealing with hydrogen, quartz tube, a boat made of SiC or the like are always etched, and contamination with metal impurities or the like are caused thereby.

Furthermore, when heat treatment is conducted in a hydrogen atmosphere, it is necessary to take out the wafer after replacing the atmosphere in the heat treatment furnace with nitrogen gas for safety. At that time, the surface of the wafer is locally etched with slight amount of oxygen and water vapor contained in nitrogen gas, which may degrading surface roughness such as haze or the like, which may lead to bonding failure when they are bonded.

Recently, it has been reported that there can be produced CZ wafer wherein Grown-in defects are significantly reduced if crystal is pulled with strictly controlling a growth rate and temperature gradient of solid-liquid interface while single crystal is grown according to Czochralski method. It can be easily expected that SOI wafer having few defects in SOI layer can be produced if such a wafer is used as a bond wafer. However, if the crystal is pulled under such significantly strict growing condition may naturally lead to lowering in yield, resulting in significant increase of cost for production.

On the other hand, single crystal produced according to FZ method has no COP defects as observed in CZ single crystal, but FZ crystal having a diameter more than 150 mm cannot be produced at commercial level. Although FZ crystal having a diameter of 200 mm can be produced at experimental level, there is no hope for producing a large diameter wafer having a diameter of 300 mm, 400 mm in the future.

DISCLOSURE OF THE INVENTION

The present invention has been accomplished to solve the above-mentioned problems. A main object of the present invention is to provide a SOI wafer that has a SOI layer having few crystal defects and high quality in high productivity, in high yield and with low cost by using a wafer wherein grown-in defects in a surface-layer part of silicon single crystal wafer produced by CZ method are eliminated or reduced effectively by heat treatment as a bond wafer of a bonded wafer.

To achieve the above mentioned object, the present invention provides a method of producing a bonded SOI wafer comprising bonding a bond wafer and a base wafer via an oxide film and then reducing thickness of the bond wafer, wherein a silicon single crystal ingot is grown according to Czochralski method, the single crystal ingot is then sliced to produce a silicon single crystal wafer, the silicon single crystal wafer is subjected to heat treatment in a non-oxidizing atmosphere at a temperature of 1100° C. to 1300° C. for one minute or more and continuously to a heat treatment in an oxidizing atmosphere at a temperature of 700° C. to 1300° C. for one minute or more without cooling the wafer to a temperature less than 700° C. to provide a silicon single crystal wafer wherein a silicon oxide film is formed on the surface, and the resultant wafer is used as the bond wafer.

As described above, if the wafer produced according to Czochralski method is subjected to heat treatment in a non-oxidizing atmosphere at a temperature of 1100° C. to 1300° C. for one minute or more and continuously to a heat treatment in an oxidizing atmosphere at a temperature of 700° C. to 1300° C. for one minute or more without cooling the wafer to a temperature less than 700° C. to provide a silicon single crystal wafer wherein a silicon oxide film is formed on the surface, and the resultant wafer is used as the bond wafer, a silicon single crystal wafer having high quality wherein Grown-in defects near the surface of the wafer that are harmful for fabrication of semiconductor device can be eliminated or decreased in short time can be used as a bond wafer, so that SOI wafer that has a SOI layer having few crystal defects and high quality can be produced in high productivity, in high yield with low cost.

The present invention also provides a method of producing a bonded SOI wafer comprising bonding a bond wafer and a base wafer via an oxide film and then reducing thickness of the bond wafer, wherein a silicon single crystal ingot is grown according to Czochralski method, the single crystal ingot is then sliced to produce a silicon single crystal wafer, the silicon single crystal wafer is subjected to heat treatment in a non-oxidizing atmosphere at a temperature of 1100° C. to 1300° C. for one minute or more and continuously to a heat treatment in an oxidizing atmosphere at a temperature of 700° C. to 1300° C. for one minute or more without cooling the wafer to a temperature less than 700° C. to provide a silicon single crystal wafer wherein a silicon oxide film is formed on the surface, at least one of hydrogen ions and rare gas ions are implanted into the surface via a silicon oxide film of the wafer to form an ion implanted layer, and the resultant wafer is used as the bond wafer, which is then brought into close contact with the base wafer via the silicon oxide film of the bond wafer, followed by delamination at the ion implanted layer by heat treatment.

As described above, in method of producing a bonded SOI wafer, by using the method wherein the wafer produced according to Czochralski method is subjected to heat treatment in a non-oxidizing atmosphere at a temperature of 1100° C. to 1300° C. for one minute or more and continuously to a heat treatment in an oxidizing atmosphere at a temperature of 700° C. to 1300° C. for one minute or more without cooling the wafer to a temperature less than 700° C. to provide a silicon single crystal wafer wherein a silicon oxide film is formed on the surface, at least one of hydrogen ions and rare gas ions are implanted into the surface via a silicon oxide film of the wafer to form an ion implanted layer, and the resultant wafer is used as the bond wafer, which is then brought into close contact with the base wafer via the silicon oxide film of the bond wafer, followed by delamination at the ion implanted layer by heat treatment (so called ion implantation delamination method), a silicon single crystal wafer having high quality can be used as a bond wafer, and surface condition of the SOI wafer after delamination is good, so that SOI wafer having excellent thickness uniformity can be produced by a relatively easy method.

In that case, the bond wafer delaminated at the ion implanted layer in the above-mentioned method of producing a bonded SOI wafer of the present invention can be used as a new bond wafer.

As described above, in the bond wafer delaminated at the ion implanted layer in the method of producing a bonded SOI wafer of the present invention, grown-in defects in zone at a depth of about 5 to 10 $\mu$m or more from the surface are eliminated, and thickness of the thin film delaminated at the ion implanted layer is about one $\mu$m at thickest, so that the bond wafer has denuded (low-defect) zone with sufficient depth, even though it is a wafer after delamination of a thin film. Accordingly, even if the surface of the wafer is polished for reuse, sufficient denuded zone remains. Therefore, if it is used as a new bond wafer, and bonded to the base wafer via the oxide film, and thickness of the bond wafer is decreased to produce a SOI wafer, it is not necessary to conduct further heat treatment of the bond wafer before bonding for elimination of grown-in defects. Thereby, a bonded SOI wafer having high quality can be produced efficiently.

Furthermore, the bond wafer delaminated at the ion implanted layer in the above-mentioned method of producing a bonded SOI wafer of the present invention can be used as a new base wafer.

At an inner part (a bulk part) than denuded zone near the surface of the bond wafer after delamination of a thin film, a lot of oxide precipitates are sometimes generated due to influence of heat treatment. In that case, if the wafer is used as a new base wafer, and bonded to the bond wafer via the oxide film, and thickness of the bond wafer is decreased to produce a SOI wafer, the SOI wafer having high performance in gettering of heavy metal impurities or the like can be obtained. In that case, even though a lot of oxide precipitates are generated in a bulk part, a surface-layer part is denuded zone as described above, so that oxide precipitates are never exposed on the surface of the base wafer, and there is no adverse effect to bonding with a bond wafer.

The above-mentioned non-oxidizing atmosphere is preferably argon, nitrogen or a mixed gas of argon and nitrogen.

Because, the atmosphere of argon, nitrogen or a mixed gas of argon and nitrogen can be easily handled and inexpensive.

The above-mentioned oxidizing atmosphere may contain water vapor.

As described above, if the oxidizing atmosphere contains water vapor, an oxidation rate is high, and defects can be eliminated efficiently in quite short time by injection of interstitial silicon. Since the oxide film formed on the bond wafer gets relatively thick, it is suitable for production of SOI wafer having a thick BOX.

In that case, the above-mentioned oxidizing atmosphere can be dry oxygen atmosphere or a mixed gas atmosphere of dry oxygen and argon or nitrogen.

As described above, if the oxidizing atmosphere is dry oxygen atmosphere or a mixed gas atmosphere of dry oxygen and argon or nitrogen, a growth rate of the oxide film is low, and thickness of the oxide film formed on the surface of the bond wafer after heat treatment can be made thin, and thus, it is suitable for production of the SOI wafer having thin BOX.

The thickness of the oxide film formed by the above-mentioned heat treatment in the oxidizing atmosphere is preferably 20 to 100 nm.

As described above, if the thickness of the oxide film formed by the above-mentioned heat treatment in the oxidizing atmosphere is more than 20 nm, COP at a surface-layer part of the bond wafer can be removed sufficiently. If the thickness is 100 nm or less, time necessary for the step can be short even in the case that the formed oxide film needs to be removed. Furthermore, in the case that the SOI wafer is produced according to the above-mentioned ion implantation delamination method, thickness uniformity of the SOI layer gets better, since an absolute value of the deviation in thickness of the oxide film on the surface gets small.

The oxide film can be previously formed on the surface of the wafer before the heat treatment in a non-oxidizing atmosphere.

If such an oxide film is previously formed, the surface of the wafer can be protected so that formation of thermal nitride film on the surface of the wafer due to heat treatment or surface roughness due to etching can be prevented. Therefore, bonding failure when the wafers are bonded can be prevented.

In that case, thickness of the thermal oxide film on the surface of the wafer after the above-mentioned heat treatment in the oxidizing atmosphere is preferably 300 nm or more.

As described above, if the thermal oxide film having a thickness of 300 nm or more is grown, COP on the surface of the wafer can be eliminated by reflow phenomenon of silicon oxide during growth of the oxide film even when the oxide film is previously formed on the surface of the wafer before conducting the heat treatment in the non-oxidizing atmosphere, so that COP on the surface of the wafer can be eliminated more surely.

A silicon single crystal ingot is preferably grown according to Czochralski method with controlling a cooling rate at 1150° C. to 1080° C. of the single crystal ingot to be 2.3° C./min or more.

As described above, if a silicon single crystal ingot is grown according to Czochralski method with controlling a cooling rate at 1150° C. to 1080° C. of the single crystal ingot to be 2.3° C./min or more, a size of grown-in defect gets small. Since the above-mentioned heat treatment is conducted to such a wafer, grown-in defects in a surface-layer part of the wafer can be eliminated or reduced more efficiently. Accordingly, a SOI wafer having a SOI layer with higher quality can be produced in high productivity.

In that case, it is preferable that a silicon single crystal ingot in which nitrogen is doped is grown according to Czochralski method.

As described above, if a silicon single crystal ingot in which nitrogen is doped is grown according to Czochralski method, the size of grown-in defect becomes smaller by nitrogen doping. Further, and the heat treatment is conducted thereto, and thus grown-in defects in a surface-layer part of the wafer can be more efficiently eliminated or removed. Accordingly, a SOI wafer having a SOI layer with higher quality can be obtained in high productivity.

In that case, when growing silicon single crystal ingot in which nitrogen is doped according to Czochralski method, the concentration of nitrogen doped in the single crystal ingot is preferably $1 \times 10^{10}$ to $5 \times 10^{15}$ atoms/cm$^3$.

Because, $1 \times 10^{10}$ atoms/cm$^3$ or more is preferable in order to suppress growth of grown-in defects sufficiently, and $5 \times 10^{15}$ atoms/cm$^3$ or less is preferable in order not to prevent formation of single crystal of silicon single crystal.

Furthermore, when the silicon single crystal ingot is grown according to Czochralski method, the concentration of oxygen contained in the single crystal ingot is preferably 18 ppma (JEIDA: Japan Electronic Industry Development Association) or less.

If oxygen concentration is low as described above, growth of crystal defects can be suppressed further, and formation of oxide precipitates at a surface layer can also be prevented.

A bonded SOI wafer produced according to the method of the present invention is, for example, a bonded SOI wafer wherein a SOI layer consists of CZ silicon single crystal wafer, thickness of the SOI layer is 5 μm or less, and 1.3 number/cm$^2$ or less of COP having a size of 0.09 μm or more exist at any region in depth direction of the SOI layer.

As described above, in the bonded SOI wafer of the present invention, there exist very few COP at any region in depth direction of SOI layer, even if thickness of SOI layer is more than 0.5 μm. Furthermore, SOI wafer of the present invention does not need to be subjected to hydrogen anneal or the like after production of SOI wafer, and thus productivity is also high.

According to the present invention, it is possible to eliminate void defects in deeper region efficiently compared with conventional methods, and therefore SOI layer with high quality can be formed. Furthermore, since heat treatment in non-oxidizing atmosphere and heat treatment in oxidizing atmosphere can be conducted in the same batch, the number of the steps in production of SOI does not increase, and thus cost therefor does not increase either. Furthermore, since heat treatment can be conducted without using hydrogen, heat treatment can be conducted with no danger of contamination from the furnace due to hydrogen and explosion. Furthermore, since CZ wafer is used, it can be applied to a wafer having a large diameter as 300 mm or more.

BRIEF DESCRIPTION OF THE DRAWINGS

FIG. 9(a) is a graph showing a relation between oxygen concentration in annealing atmosphere and number of COP, a FIG. 9(b) is a graph showing a relation between a thickness of oxide film formed by annealing and number of COP.

BEST MODE FOR CARRYING OUT THE INVENTION

The embodiment of the present invention will be further described below, but is not limited thereto.

The inventors have found that grown-in defects on the surface and in a surface-layer part of the wafer can be eliminated or reduced, and surface roughness of the wafer can be improved by producing a silicon wafer according to Czochralski method and then subjecting the wafer continuously to heat treatment at high temperature in non-oxidizing atmosphere, especially in atmosphere of argon, nitrogen, or mixed atmosphere thereof, and oxidation heat treatment at high temperature in oxidizing atmosphere, and that a SOI wafer having an excellent SOI layer can be produced in high productivity by using the silicon wafer as a bond wafer of a bonded SOI wafer, and have studied condition further, and thereby completed the present invention.

As described above, in order to eliminate or reduce, grown-in defects on the surface and in a surface-layer part of the wafer, a wafer used generally in commercial level is a wafer grown at a general crystal growth rate of about 1.0 mm/min or more and subjected to heat treatment at high temperature in hydrogen atmosphere to eliminate grown-in defects. The method has already been used for actual production of devices, but defects still remains in a surface-layer part of the wafer (for example, 0 to 5 μm from the surface).

Reasons therefor have been considered as follows. Two steps are necessary in order to eliminate grown-in defects that are aggregations of atomic vacancy. Namely, they are a step of melting an inner wall oxide film of defects, which prevents true point defects from changing into grown-in defects, and a subsequent step of filling the grown-in defect with interstitial silicon.

In the heat treatment at high temperature in hydrogen atmosphere, it is considered that melting of an inner wall oxide film of grown-in defects in a surface-layer part of the wafer can be efficiently caused by significant oxygen out-diffusing effect. However, filling of grown-in defect with interstitial silicon cannot be caused efficiently, since both of interstitial silicon that is a Schottky defect and atomic vacancy are injected from the surface of the wafer under heat treatment at high temperature in hydrogen atmosphere.

Accordingly, it takes long time for a step of filling grown-in defects with interstitial silicon in heat treatment at high temperature in hydrogen atmosphere. Especially, in order to eliminate grown-in defect having a size of 150 nm or more in terms of their diameter, it is necessary to perform a heat treatment at high temperature as 1200° C. for long time as 5 hours or more.

It lowers productivity of the wafer, and is not preferable from a point of safety, since it requires heat treatment at high temperature in hydrogen atmosphere for long time. Furthermore, since heat treatment at high temperature for long time is conducted, oxygen precipitation nuclei in silicon single crystal wafer are also eliminated, gettering effect of heavy metal that is effective for device process are also lost.

The inventors solved the above problems by conducting heat treatment in a non-oxidizing gas containing hydrogen less than explosion limit (about 4%), especially atmosphere of argon, nitrogen or mixture thereof, at a temperature of 1100° C. to 1300° C. for one minute or more and continuously to a heat treatment in an oxidizing atmosphere at a temperature of 700° C. to 1300° C. for one minute or more without cooling the wafer to a temperature less than 700° C. Namely, a step of melting of an inner wall oxide film of defects is efficiently conducted by heat treatment at high temperature in atmosphere of argon, nitrogen or a mixed gas thereof, and then heat treatment in oxidizing atmosphere is continuously conducted to progress efficiently a step of filling grown-in defect with interstitial silicon.

The step of melting of an inner wall oxide film of defects is efficiently conducted by heat treatment at high temperature in atmosphere of non-oxidizing gas containing hydrogen less than explosion limit (about 4%), especially, argon, nitrogen or a mixed gas thereof, since it is quite difficult from the point of safety that heat treatment in oxygen atmosphere is continuously conducted after heat treatment at high temperature in hydrogen atmosphere. Two steps of heat treatment can be continuously safely conducted only by using atmosphere of non-oxidizing gas containing hydrogen less than explosion limit (about 4%) especially, argon, nitrogen or a mixed gas thereof, instead of hydrogen atmosphere. Moreover, due to oxygen out-diffusion effect, melting of inner wall oxide film of grown-in defects is conducted efficiently in heat treatment at high temperature in atmosphere of non-oxidizing gas, especially argon, nitrogen or mixed gas thereof, as well as it is conducted in hydrogen atmosphere.

It is considered that oxygen out-diffusion effect in argon atmosphere is equivalent to that in hydrogen atmosphere, since natural oxide film on the surface of the wafer is sublimated as SiO gas and removed in heat treatment at high temperature as 1100 to 1300° C. in argon atmosphere. In nitrogen atmosphere, out-diffusion effect is equivalent to that in hydrogen atmosphere, but natural oxide film on the surface cannot be removed uniformly. Accordingly, it is preferable to remove the natural oxide film previously before heat treatment with HF aqueous solution. Furthermore, in a mixed atmosphere of argon and nitrogen, out-diffusion effect is equivalent to that achieved in hydrogen atmosphere.

The heat treatment is conducted at 1100 to 1300° C. for one minute or more in order to melt sufficiently inner wall oxide film of the grown-in defect.

In heat treatment at high temperature in nitrogen atmosphere, very stable thermal nitride film is formed on the surface of the silicon wafer, and it sometimes takes long time to remove the film in the later processes, or surface roughness on the surface of the wafer is sometimes caused by slight amount of oxygen or water vapor in nitrogen. The inventors have found that formation of unnecessary film and surface roughness on the surface of the wafer caused in nitrogen atmosphere can be prevented by previously forming a protection oxide film on the surface of the wafer before heat treatment.

Furthermore, with such a protection oxide film, in addition to the effect of protection of the surface of the wafer against formation of unnecessary film and surface roughness, an effect of preventing contamination with heavy metal impurities diffused inside of the wafer from the furnace during heat treatment can be achieved.

Furthermore, a step of melting the inner wall oxide film of defect and a step of filling grown-in defects with interstitial silicon are continuously conducted from the following reason. If these two steps of heat treatment are not conducted continuously, the inner wall oxide film of grown-in defect is grown again due to lowering of temperature of the wafer, and as a result defects cannot be eliminated or reduced. Therefore, these two steps of heat treatment are continuously conducted without cooling to the temperature less than 700° C. at which the inner wall oxide film of grown-in defects begin to grow again.

In the present invention, a step of filling grown-in defect is conducted by heat treatment in oxidizing atmosphere. Because, according to the heat treatment in oxidizing atmosphere, differently from the heat treatment in hydrogen atmosphere, atomic vacancy is never injected, but only interstitial silicon is injected from the surface of the wafer, so that grown-in defects can be efficiently filled with interstitial silicon, and grown-in defects can be eliminated, and surface roughness and contamination can be prevented by oxidizing the surface activated by the heat treatment at high temperature in non-oxidizing atmosphere.

In order to fill and eliminate grown-in defects sufficiently, the heat treatment is preferably conducted at 1000° C. to 1300° C. for one minute or more. However, at temperature of 700° C. or more, reduction of grown-in defects and prevention of surface roughness can be achieved.

As the oxidizing atmosphere, atmosphere containing water vapor, dry oxygen (dry $O_2$) 100% atmosphere, or a mixed gas of dry oxygen and argon or nitrogen atmosphere or the like can be adopted.

Using atmosphere containing water vapor, an oxidation rate is high, so that interstitial silicon can be injected efficiently in very short time to eliminate defects at a relatively low temperature around 700° C. In that case, thickness of the oxide film formed on the surface is relatively thick, it is suitable for the case that SOI having a thick buried oxide film is produced.

On the other hand, using dry oxygen atmosphere or a mixed gas atmosphere of dry oxygen and argon or nitrogen, a growing rate of an oxide film is low, thickness of the oxide film formed after heat treatment can be thin. Therefore, it is suitable for the case that the formed oxide film needs to be removed with an aqueous solution of HF or the like, or the case that the above-mentioned ion implantation delamination method is used.

If a growth rate of the oxide film is low and thickness of the formed oxide film is thin, in the case that the mixed gas atmosphere is used or the like, it has been considered that the effect of eliminating defects by injecting the interstitial silicon is inferior. The inventors performed the following experiments to confirm what oxygen concentration and thickness of the oxide film are enough for sufficiently eliminating defects.

Annealing in argon 100% atmosphere, at 1200° C., for 40 minutes was conducted, and then annealing in 6 kinds of mixed gas of argon and dry oxygen each of which has different oxygen concentration (oxygen concentration 0, 10, 20, 30, 50, 100%) for 20 minutes was conducted. Then, the surface of the wafer was polished with a stock removal of 5 $\mu$m, and COP having a size of 0.9 $\mu$m or more was measured. The results were shown in FIGS. 9(a), (b). Polishing with a stock removal of 5 $\mu$m was conducted in order to observe effect of elimination of COP in a surface-layer part of the wafer. FIG. 9(a) shows a relation between oxygen concentration in annealing atmosphere and the number of COP. FIG. 9(b) shows a relation between thickness of the oxide film formed by annealing and the number of COP.

Figure 9:
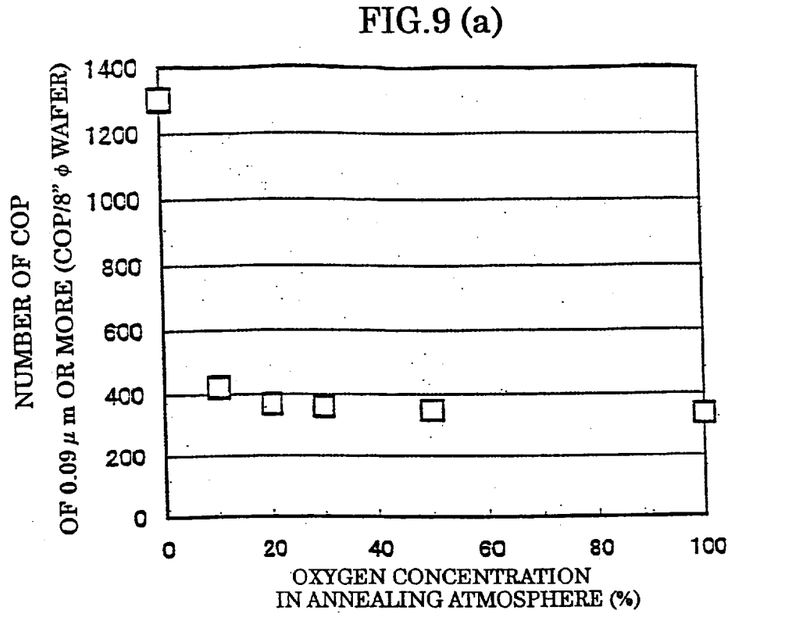

As shown in FIG. 9, even if dry oxygen concentration in a mixed gas atmosphere is only about 10%, in the case that the thickness of the oxide film is 20 nm or more, effect equivalent to that in the case of using dry oxygen 100% (thickness of oxide film is about 100 nm) can be obtained.

Figure 10:
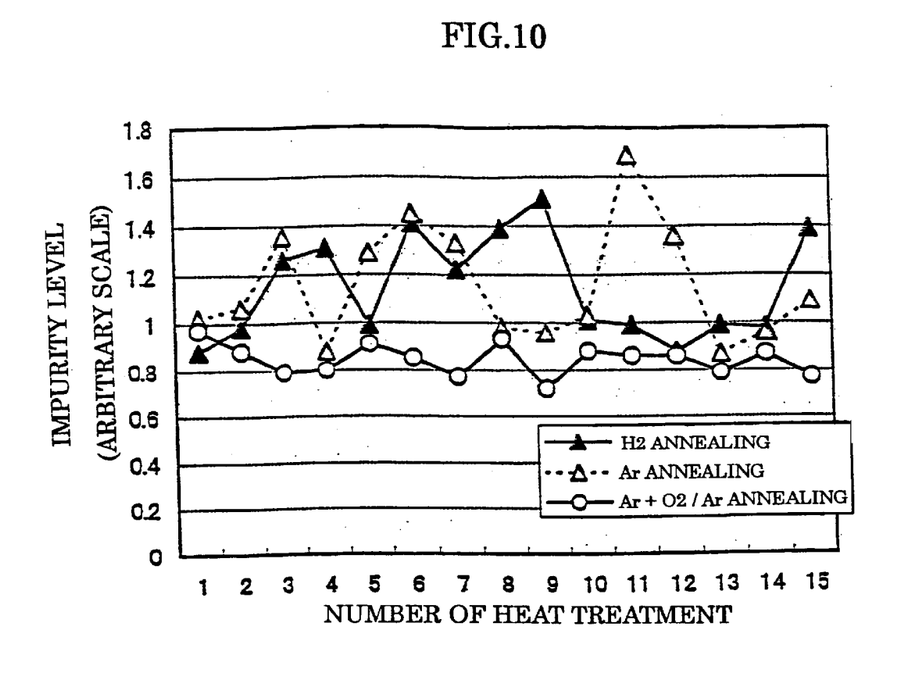
FIG. 10 is a graph showing comparison of transition of contamination level of metal impurities when each of heat treatment of the present invention and conventional invention is conducted in different tubes repeatedly.

Furthermore, it has been found that heat treatment in oxidizing atmosphere after the heat treatment in non-oxidizing atmosphere has an effect of preventing contamination of the wafer from a tube or a boat to a minimum. FIG. 10 shows comparison of change of contamination level of metal impurities in the wafer in the case that annealing in argon 100% atmosphere at 1200° C. for 40 minutes is conducted and then heat treatment in an atmosphere of mixed gas of argon and dry oxygen (oxygen concentration 30%) for 20 minutes is conducted, and in the case that heat treatment in hydrogen 100% or argon 100% atmosphere at 1200° C. for 60 minutes is conducted, in each case different tube is used, and heat treatment was conducted repeatedly. Measurement of contamination level was conducted using SPV (Surface Photo Voltage: trade name, a wafer contamination monitoring system) manufactured by Semiconductor Diagnostic Inc. (SDI).

It is clear that annealing only with hydrogen or argon may cause etching of a tube or a boat, which may lead to sudden degrading of impurity level. On the other hand, as for the heat treatment containing annealing in oxidizing atmosphere, oxide film is formed on the surface of the wafer and the surface of a boat or a tube, and therefore the oxide film for protection are always formed, and thus it is considered that contamination from a tube or a boat can be suppressed to a minimum.

Defects that can be eliminated by the oxidation heat treatment at 700 to 1300° C. are limited to crystal defects that are not exposed on the surface of the silicon wafer and exist inside of the wafer. Because, elimination of the defects herein is conducted by injecting interstitial silicon from the surface due to oxidation to fill the void type crystal defects therewith. Accordingly, the void type crystal defects such as COP that are exposed on the surface need to be previously eliminated by migration of silicon atoms on the surface of the wafer by heat treatment in argon atmosphere or the like before the oxidation heat treatment. However, if surface protection oxide film is formed, migration of the surface silicon atoms is suppressed, so that COP on the surface may be eliminated insufficiently.

The inventors thought out a method of eliminating COP on the surface of the wafer sufficiently by forming a thermal oxide film with a thickness of 300 nm or more on the surface of the wafer after the above-mentioned oxidation heat treatment at 700 to 1300° C., in the case of previously forming surface protection oxide film before heat treatment in non-oxidizing atmosphere. Because, if thickness of the thermal oxide film on the surface of the wafer after oxidation heat treatment is 300 nm or more, the shape of COP on the surface gets smooth during a process of growing the thermal oxide film, and substantially the same effect as elimination of COP can be achieved. An average size of COP on the surface of the wafer is 100 to 200 nm. If an oxide film having a thickness about 300 nm is formed, it is enough to take COP into the oxide film and eliminate them.

The oxide film formed by the oxidation heat treatment can be removed with an aqueous solution of HF or the like.

Furthermore, the inventors have found that silicon wafer having a large size and have few grown-in defects can be produced in high productivity by a method of growing silicon single crystal ingot according to Czochralski method with controlling a cooling rate at 1150° C. to 1080° C. to be 2.3° C./min or more, and a method of growing silicon single crystal ingot in which nitrogen is doped, and that the effect of eliminating or reducing grown-in defects can be improved by subjecting the said silicon wafer to the above-mentioned non-oxidizing heating treatment and oxidation heat treatment of the present invention.

Namely, it is said that grown-in defects aggregates at temperature in the range of 1150° C. to 1080° C. during pulling of crystal. Accordingly, if a cooling rate in the temperature range of 1150 to 1080° C. is made 2.3° C./min or more and staying time is shorten, size and number of grown-in defect can be controlled.

It is pointed out that the agglomeration of atomic vacancies in silicon single crystal can be suppressed, if nitrogen is doped in the silicon single crystal (T. Abe and H. Takeno, Mat. Res. Soc. Symp. Proc. Vol.262,3,1992). It is considered that the effect can be achieved as a result that vacancy agglomeration process is transited from homogenous nucleus formation to heterogeneous nucleus formation. Accordingly, silicon single crystal having small grown-in defect can be obtained by growing the silicon single crystal by CZ method with doping nitrogen, and thus the silicon single crystal wafer can be obtained by processing it. According to the method, it is not always necessary to decrease growth rate of the crystal, differently from the conventional method, and thus a silicon single crystal wafer can be produced in high productivity.

It is preferable that oxygen concentration in a single crystal ingot is 18 ppma or less, when the silicon single crystal ingot is grown by Czochralski method. Because, if oxygen concentration is low as above, growth of crystal defects can be further suppressed, and formation of oxide precipitates near the surface of the wafer can be prevented. Especially, when nitrogen is doped in single crystal, oxygen precipitation is accelerated, and thus it is preferable that formation of oxide precipitates near the surface of the wafer is prevented by using the oxygen concentration in the above-mentioned range.

In the present invention, control of size and number of grown-in defects with a cooling rate in Czochralski method can be performed by changing a pulling rate of the crystal. For example, when a certain specific pulling apparatus is used, a cooling rate achieved with a pulling rate of 1.8 mm/min is higher than a cooling rate achieved with a pulling rate of 1.0 mm/min by the same apparatus. As other methods, position and structure or the like of members in the furnace of a pulling apparatus called hot zone can be changed to control a cooling rate at a temperature of 1150–1080° C.

The size of grown-in defect can also be controlled by doping nitrogen impurity while single crystal is grown according to Czochralski method. In that case, silicon single crystal ingot in which nitrogen is doped can be grown by a known method such as disclosed in, for example, Japanese Patent Application Laid-open (kokai) No 60-251190.

Namely, nitrogen can be doped in a silicon single crystal by placing nitride previously in the quartz crucible before growing silicon single crystal ingot, adding nitride into the growing silicon melt, or by using an atmosphere gas containing nitrogen. The doping amount in the crystal can be controlled by controlling the amount of nitride, concentration or time of introduction of nitrogen gas.

As described above, agglomeration of grown-in defects can be suppressed by doping nitrogen when the single crystal is grown according to Czochralski method.

As for the reason for the size reduction of crystal defects introduced into silicon when nitrogen is doped in the silicon single crystal, atomic vacancy agglomeration process is transited from homogenous nucleus formation to heterogeneous nucleus formation as described above.

Accordingly, the concentration of nitrogen to be doped is preferably $1 \times 10^{10}$ atoms/cm$^3$ or more, more preferably $5 \times 10^{13}$ atoms/cm$^3$ or more, in which ranges the heterogeneous nucleus formation is sufficiently caused. Thereby, agglomeration of crystal defects can be sufficiently suppressed.

On the other hand, if nitrogen concentration is more than $5 \times 10^{15}$ atoms/cm$^3$, which is solid solubility of nitrogen in silicon single crystal, crystallization of the silicon single crystal is inhibited. Therefore, it should not be more than the above concentration.

In the present invention, it is preferable that oxygen concentration in the single crystal ingot is 18 ppma or less, when the silicon single crystal ingot is grown by Czochralski method. Oxygen concentration contained in the single crystal ingot can be lowered so as to fall in the above range by a conventional method, when a silicon single crystal ingot is grown. For example, oxygen concentration can be easily controlled to fall in the above mentioned range by reducing the number of rotation of a crucible, increasing volume of flowing gas, lowering an atmosphere pressure, controlling temperature distribution and convection of a silicon melt or the like.

Thereby, the silicon single crystal ingot wherein size and number of grown-in defects are reduced, can be thus obtained according to Czochralski method. After it is sliced according to a general method with a cutting machine such as an inner diameter slicer, a wire saw or the like, it is subjected to processes including chamfering, lapping, etching, polishing and the like to be a silicon single crystal wafer. Of course, such processes are merely examples, and various other processes such as cleaning or the like can be conducted, and process can be changed appropriately depending on the purpose, namely, order of processes can be changed, and some processes can be omitted.

Figure 1:
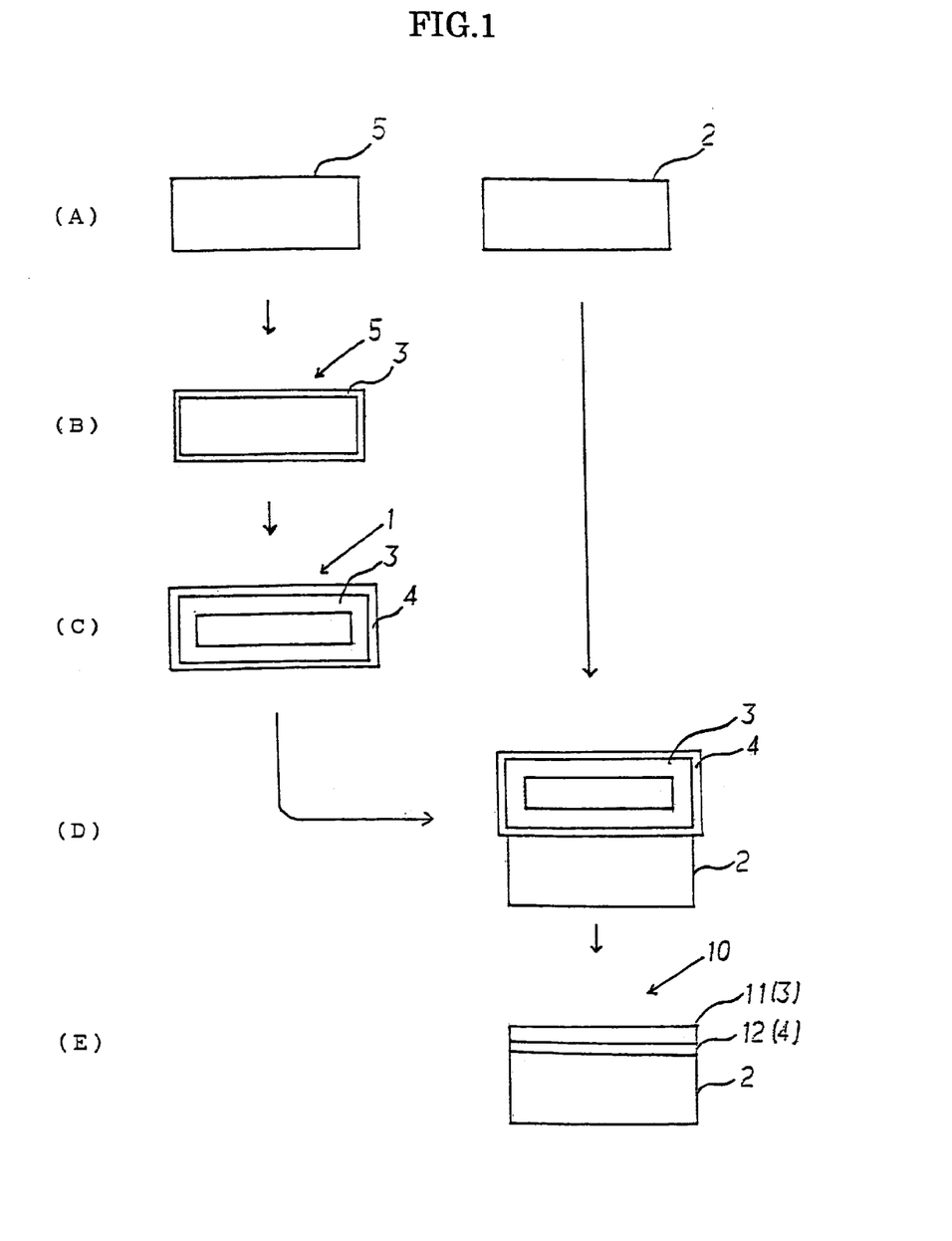
FIG. 1 is a flow chart showing one example of production processes of a bonded SOI wafer according to the present invention.
Figure 2:
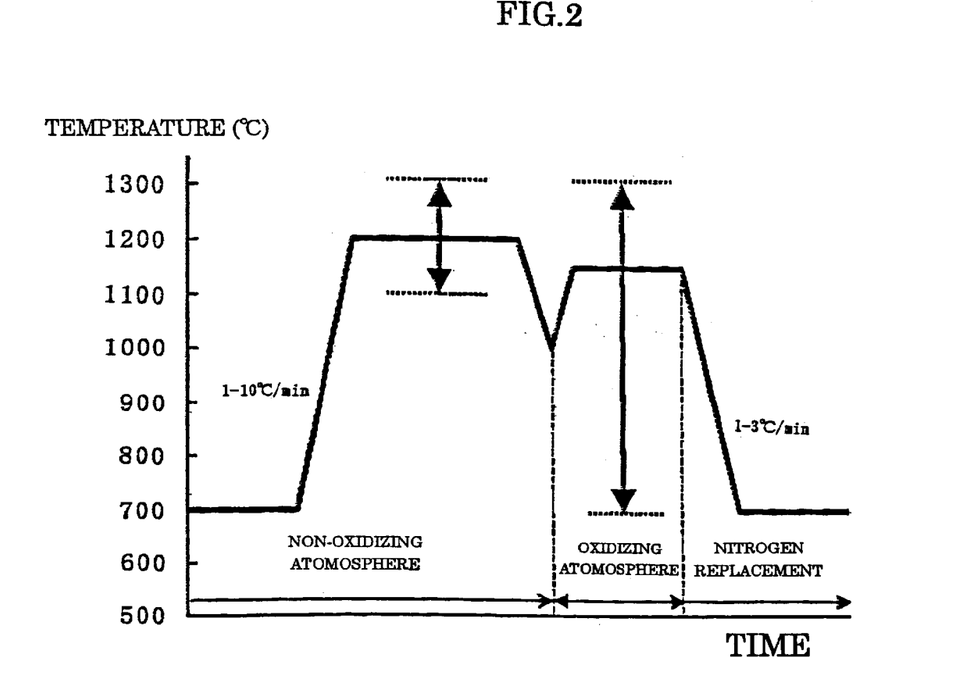
FIG. 2 is a view showing outline of heat treatment applied to a silicon single crystal wafer to be a bond wafer before bonding.

Thereby, CZ silicon single crystal wafer used as a bond wafer in the present invention can be obtained. A method of producing SOI wafer of the present invention using the CZ silicon wafer will be explained below. FIGS. 1(A) to (E) is a flow chart showing one example of the process for producing a bonded SOI wafer of the present invention. FIG. 2 shows outline of the heat treatment to which the silicon single crystal wafer to be a bond wafer is subjected before bonding.

First, CZ silicon single crystal wafer 5 that is to be a bond wafer is subjected to heat treatment consisting of two steps shown in FIGS. 1(B) and (C) and FIG. 2. First, as the first step, annealing is conducted in a temperature range of 1100° C. to 1300° C. in 100% Ar gas atmosphere for more than one minute to out-diffuse oxygen in the crystal and melt oxide film inner wall of void defects. Thereby, low-defect layer 3 is formed in the silicon single crystal wafer 5 (FIG. 1(B), FIG. 2). Then, annealing is conducted continuously in an oxidizing atmosphere at a temperature of 700° C. to 1300° C. for one minute or more without cooling the wafer to a temperature less than 700° C. to form an oxide film 4, to inject interstitial silicon from an interface of Si/SiO$_2$, and eliminate void defects to a deeper part of the crystal, and enlarge the low-defect layer 3 (FIG. 1(C), FIG. 2). According to the method, COP can be effectively eliminated from the surface to the depth of about 5 to 10 μm or more.

The heat treatment can be conducted using any types of heat treatment furnace commercially available, as far as it is a heat treatment furnace wherein cleanness is controlled.

For example, a heater heating horizontal type or vertical type diffusion furnace can be used, or a lamp heating type single wafer processing wafer heating apparatus can be used. It is important that sufficient heat treatment temperature and heat treatment time in non-oxidizing atmosphere and heat treatment temperature and heat treatment time for the subsequent heat treatment in oxidizing atmosphere are ensured in order to eliminate or reduce grown-in defects effectively, and that two heat treatments are conducted continuously so that temperature is not lowered too much.

Therefore, it is necessary to subject silicon single crystal wafer 5 to heat treatment in a non-oxidizing atmosphere, especially argon, nitrogen or mixed gas of argon and nitrogen at a temperature of 1100 to 1300° C. for one minute or more, and then to subsequent oxidation in an oxidizing atmosphere at a temperature of 700° C. to 1300° C. for one minute or more without cooling the wafer to a temperature less than 700° C.

As described above, if the heat treatment in a non-oxidizing atmosphere, especially argon, nitrogen or mixed gas of argon and nitrogen and the subsequent oxidation heat treatment are not conducted continuously, the inner wall oxide film of grown-in defects are grown, and as a result the defects cannot be eliminated or reduced. Accordingly, it is preferable to conduct continuously the heat treatment in an atmosphere of argon or the like, and subsequent oxidation heat treatment, before the wafer 5 is cooled to the temperature less than 700° C., without taking out the wafer 5 from the furnace. Furthermore, heat treatment time can be shorten, since the heat treatments are conducted continuously at the same temperature.

In order to conduct the heat treatment as above, after heat treatment in an atmosphere of argon, nitrogen or a mixed gas of argon and nitrogen or the like is conducted, the atmosphere gas was exhausted, and oxygen gas is subsequently introduced at desired concentration to conduct the oxidation heat treatment. According to the present invention, since the initial heat treatment for melting an inner wall oxide film of defects is conducted in non-oxidizing gas atmosphere such as argon, nitrogen or a mixed gas of argon that contains hydrogen in an amount less than explosion limit (about 4%), the next oxidation heat treatment can be safely even if a conventional commercially available furnace is used.

Furthermore, in the case that a protection oxide film is previously formed on the surface of the wafer that is to be subjected to the heat treatment for melting of inner wall oxide film of defects in non-oxidizing atmosphere such as argon, nitrogen or a mixed gas of argon and nitrogen, the heat treatment for forming the above oxide film can be conducted continuously before the heat treatment for melting an inner wall oxide film, or it can be conducted previously as an independent step. The oxide film may be formed, for example, by thermal oxidation such as so-called dry oxidation using dry oxygen, wet oxidation containing water vapor, or CVD oxide film formed by CVD (Chemical Vapor Deposition) method.

Heat treatment in oxidizing atmosphere as the second step shown in FIG. 1(C) and FIG. 2 can be conducted by either dry oxidation in an atmosphere containing no water vapor or wet oxidation in an atmosphere containing water vapor. In both the ways above, equivalent effect can be expected as for injection of interstitial silicon into grown-in defects and improvement in surface roughness that are essential objects of the present invention.

Then, as shown in FIG. 1(D), a bonded SOI wafer is produced using the above silicon single crystal wafer on which the silicon oxide film is formed as a bond wafer 1. As shown in FIG. 1(D), since the oxide film 4 formed in the preceding step is used as BOX of SOI wafer, steps can be simplified. Furthermore, since an oxide film is formed after Ar-annealing, BOX can be formed excellent in film quality. The wafer is brought in close contact with a base wafer 2 via the BOX at room temperature, and subjected to the bonding heat treatment at 200° C. or more, generally at about 1000° C. to 1200° C. As the base wafer 2, a silicon single crystal wafer is generally used, but insulator substrate (quartz, sapphire or the like) can also be used depending on the use. Furthermore, in the case that a silicon single crystal wafer is used, it can be bonded to a base wafer 2 after an oxide film is formed on the base wafer.

After conducting the bonding heat treatment, SOI wafer 10 is produced by conducting general process for decreasing thickness such as grinding, polishing or the like (FIG. 1(E)). Thereby, there can be obtained the bonded SOI wafer 10 wherein BOX 12 consisting of the oxide film 4 and the SOI layer 11 consisting of the low-defect layer 3 are formed on the base wafer 2. Since the SOI layer 11 of the SOI wafer 10 consists of the low-defect layer 3, there are very few defects such as COP at any region in depth direction. In that case, a vapor phase etching called PACE (Plasma Assisted Chemical Etching) can be conducted to decrease thickness of the bond wafer 1 (Japanese Patent No. 256567).

In the case that SOI wafer is produced using ion implantation delamination method (technique called smart-cut, Japanese Patent Application Laid Open (Kokai) No. 5-211128), an oxide film 4 is formed on the surface of the silicon single crystal wafer 5 by the above-mentioned two step heat treatment, and then hydrogen ions or rare gas ions are implanted through the oxide film 4, and it is used as a bond wafer 1, which is then bonded to the base wafer 2.

In that case, since deviation in thickness of the formed SOI layer is a total of deviation in depth of ion implantation and deviation of thickness of the oxide film, in order to decrease it as possible, it is desirable to decrease thickness of the oxide film 4 formed on the silicon single crystal wafer 5 that is to be a bond wafer 1 as possible to decrease an absolute value of deviation in thickness of the oxide film prepared. Therefore, thickness of the oxide film is preferably 100 nm or less, and preferably 20 nm or more in order to obtain effect of eliminating defects.

In the case that thickness of the oxide film formed on the bond wafer is 100 nm or less as described above, and a thicker BOX of SOI wafer is necessary from the point of device design, it may be bonded to the base wafer after the lacking oxide film is formed.

Furthermore, the bond wafer that is delaminated when SOI wafer is produced according to such a hydrogen ion implantation delamination method can be used as a new bond wafer or a base wafer. As described above, the bond wafer produced as a byproduct after delamination has a denuded zone with sufficient depth in a surface-layer part, and contains a sufficient amount of oxide precipitate precipitated in a bulk part due to heat treatment, so that it can be a good bond wafer or a good base wafer.

In that case, one surface of the wafer produced as byproduct in the present invention is a delaminated surface, and the surface of the other side is a plain surface of original silicon wafer. Accordingly, treatment such as grinding, polishing or the like has to be applied only on the delaminated surface. Accordingly, the process is simple since only one surface is treated, and stock removal is slight. Namely, when a silicon wafer is provided by slicing a general silicon ingot, both surfaces are cut surface, so that steps such as a lapping step, an etching step or the like are necessary, and the stock removal is large. However, the delaminated wafer of the present invention has a plain surface on one side, and therefore only the delaminated surface has to be ground or polished on the basis of the plain surface, and the same plain surface as a general silicon mirror surface wafer can be obtained with a slight stock removal.

If the silicon wafer obtained by reprocessing the delaminated wafer is reused as a bond wafer or a base wafer of a SOI wafer, substantially one SOI wafer can be obtained from one silicon wafer, so that silicon wafer can be used effectively as material.

EXAMPLES

The following examples and comparative examples are being submitted to further explain the present invention. These examples are not intended to limit the scope of the present invention.

Example 1, Comparative Example 1, Comparative Example 2

In accordance with the method of the present invention, a bond wafer of a bonded SOI wafer was produced, and quality thereof was evaluated. As a silicon single crystal wafer that is to be a bond wafer, a wafer sliced from 8"φCZ silicon single crystal having orientation <100>, interstitial oxygen concentration of 16 ppma (JEIDA) pulled with a pulling rate of 1.2 mm/min was used.

The wafer was subjected to the heat treatment of the present invention. Annealing was conducted at 1200° C. for 40 minutes in an atmosphere of 100% Ar using VERTEX3 (DD-813V) manufactured by Kokusai Electric Co., Ltd., as an annealing furnace, and subsequently annealing at the same temperature in an atmosphere of a mixed gas of 30% oxygen and 70% argon for 20 minutes was conducted. An oxide film having a thickness of about 30 nm was formed.

The wafer subjected to annealing was then subjected to treatment for removing an oxide film with a solution of hydrofluoric acid, and then to polishing with a stock removal of 5 μm, and then the number of COP (size of 0.09 μm or more) at a deep zone was measured. Measurement of COP was conducted using SurfScan SP1 manufactured by KLA Tencor Corporation. For comparison, a wafer obtained by subjecting the same silicon single crystal wafer as above to annealing of $H_2$/1200° C./one hour (Comparative example 1) and a wafer obtained by subjecting the same wafer to annealing of Ar/1200° C./one hour (Comparative example 2) were polished with a stock removal of 5 μm, and the number of COP was measured in a similar method to the above.

Figure 3:
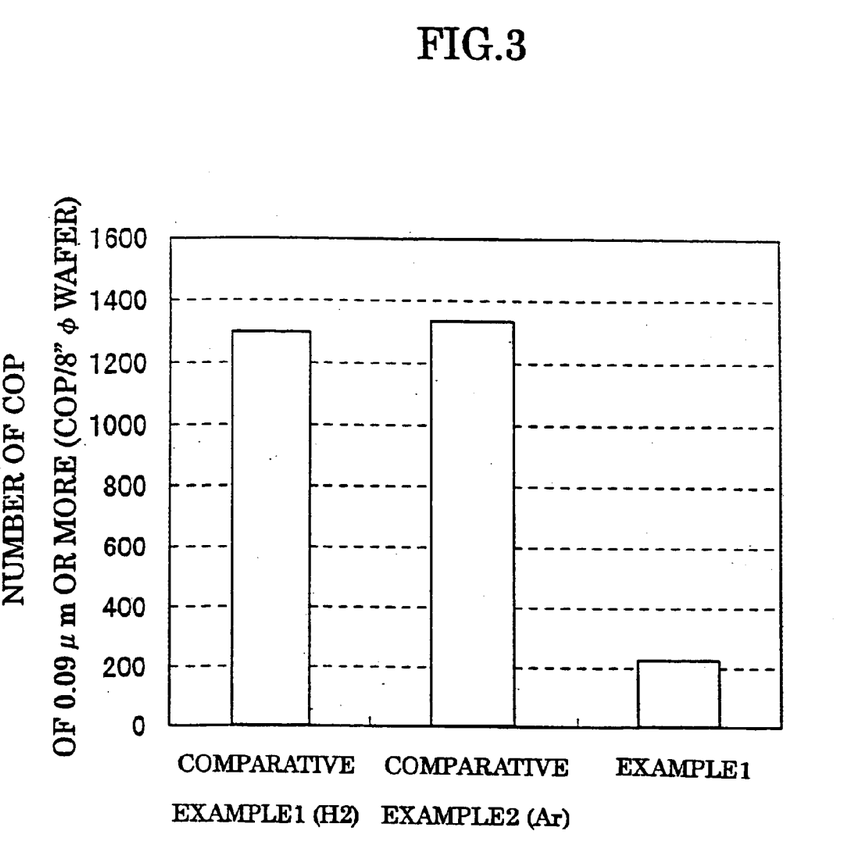
FIG. 3 is a graph showing number of COP in the wafer after heat treatment in Example 1, Comparative Example 1 and Comparative Example 2.

The result of measurement was shown in FIG. 3. As shown in FIG. 3, the number of COP in the wafer of Example 1 was 400 or less in a 8-inch wafer, which corresponded to COP density of $1.3/cm^2$ or less. Accordingly, the method of the present invention had a higher grown-in defect eliminating effect compared with conventional $H_2$- or Ar-annealing.

Oxide dielectric breakdown voltage of the wafers polished with a stock removal of 5 μm was measured. The results were shown in FIG. 4 and FIG. 5. A good chip yield of TDDB (Time Dependent Dielectric Breakdown) herein means a good chip yield when a chip having a time dependent dielectric breakdown voltage of 25 $C/cm^2$ or more measured under the condition: gate oxide film thickness of 25 nm, gate area of 4 $mm^2$, stress electric current of 0.01 $A/cm^2$ and room temperature, or a chip having a time dependent dielectric breakdown voltage of 5 $C/cm^2$ or more measured under the condition: gate oxide film thickness of 25 nm, gate area of 4 $mm^2$, stress electric current of 0.01 $A/cm^2$ and 100° C., is defined as a good chip.

A good chip yield of TZDB (Time Zero Dielectric Breakdown) herein means a good chip yield when a chip having a time zero dielectric breakdown voltage of 8 MV/cm or more measured under the condition: gate oxide film thickness of 25 nm, gate area of 8 $mm^2$, 1 $mA/cm^2$ of electric current density in decision at room temperature is defined as a good chip.

Figure 4:
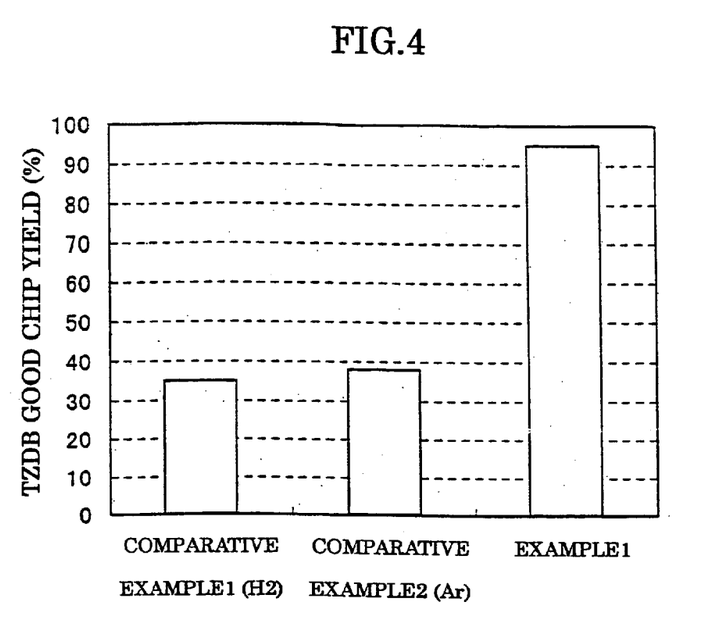
FIG. 4 is a graph showing TZDB good chip yield in the wafer after heat treatment in Example 1, Comparative Example 1 and Comparative Example 2.
Figure 5:
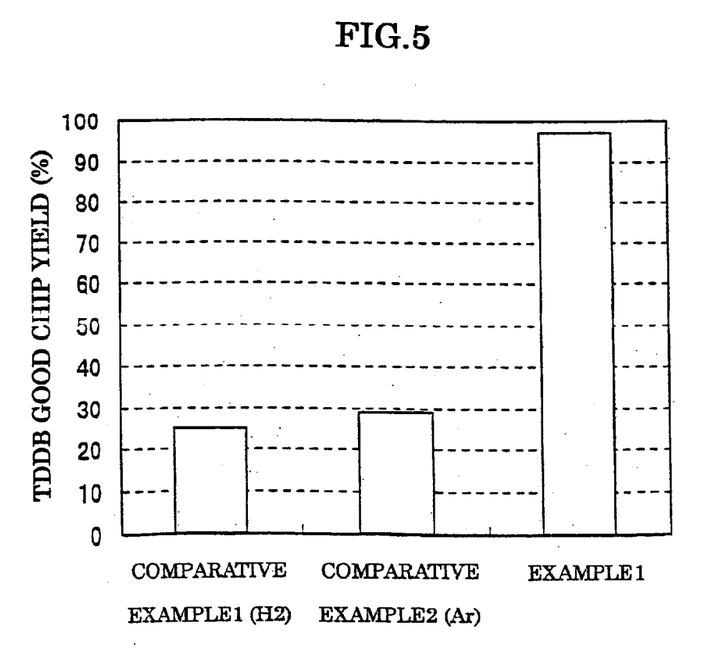
FIG. 5 is a graph showing TDDB good chip yield in the wafer after heat treatment in Example 1, Comparative Example 1 and Comparative Example 2.

As shown in FIGS. 4 and 5, the wafer subjected to the heat treatment of the present invention had excellent oxide dielectric breakdown voltage even in a deep zone, compared to the wafers subjected to $H_2$- or Ar-annealing.

From the above results, it is clear that if a silicon single crystal that is to be a bond wafer is produced according to the method of the present invention, the wafer having few crystal defects and excellent oxide dielectric breakdown voltage can be produced. Accordingly, if a SOI wafer is produced using such a silicon single crystal wafer, SOI wafer having few crystal defects can be obtained.

The SOI wafers having SOI layer with a thickness of about 0.1 μm were produced according to an ion implantation delamination method, using three kinds of bond wafers produced under the above-mentioned condition. Production condition was as follows.

1) Hydrogen ion implantation condition:
    H+ion, implantation energy 30 keV
2) Delamination heat treatment condition:
    oxidizing atmosphere, 500° C., 30 minutes
3) Bonding heat treatment condition:
    nitrogen atmosphere (containing slight amount of oxygen), 1200° C., 120 minutes
4) Touch polishing (polishing with slight stock removal on the surface of SOI) done
5) Base wafer oxide film: 300 nm COP in SOI wafer produced above was observed according to a HF dip method. The HF dip method comprises dipping the SOI wafer having the thin SOI layer as above was dipped in a 50% aqueous solution of HF, if there is a defect penetrating the SOI layer, HF reaches BOX through it to etch the oxide film and form etch pits, and observing etch pits with a microscope through the thin SOI layer to evaluate COP in a wafer. The results were shown in Table 1.

TABLE 1

| | Heat treatment atmosphere | COP density (number/$cm^2$) |
|---|---|---|
| Example 1 | Ar + Ar/$O_2$ | 0.2 |
| Comparative Example 1 | only $H_2$ | 1.8 |
| Comparative Example 2 | only Ar | 1.9 |

As shown in Table 1, SOI wafer of Example contains very few COP penetrating the SOI layer, compared with conventional SOI wafers obtained by subjecting bond wafers only to $H_2$-annealing or Ar-annealing. As described above, the density of COP having a size of 0.09 μm or more in the SOI wafer of Example 1 was $1.3/cm^2$ or less at any depth in the SOI layer. Namely, SOI wafer having quite excellent quality can be obtained.

Although there remained a step of about 0.2 to 0.3 μm in a peripheral part of the bond wafer after delamination formed as byproduct when SOI wafer of Example 1 was produced, the step could be removed only by removing the oxide film on the surface, and then polishing the delaminated surface with a stock removal of about 1 μm, and good mirror surface having no exposed oxide precipitates could be obtained. Accordingly, it was confirmed that there was no problem in bonding even when the wafer was used as a new bond wafer or a base wafer.

Example 1, Example 2 and Example 3

In accordance with the method of the present invention, a bond wafer of a bonded SOI wafer was produced using three kinds of silicon single crystal wafer, and quality thereof was evaluated. As silicon single crystal wafers, the wafer used in Example 1, the wafer sliced from a single crystal produced under the same condition as Example 1 except that a pulling rate of the single crystal was 1.9 mm/min (Example 2), and the wafer sliced from a single crystal produced under the same condition as Example 1 except that the crystal in which nitrogen was doped at $10^{14}$ atoms/$cm^3$. These wafers were subjected to annealing at 1200° C. for 40 minutes in an atmosphere of 100% Ar, and then annealing at the same temperature in an atmosphere of a mixed gas of 30% oxygen and 70% argon for 20 minutes. After removing an oxide film with a HF solution, and the wafers were polished with a stock removal of 5 µm, and then the number of COP (≧0.09 µm) at a deep zone was measured. The results were shown in FIG. 6.

Figure 6:
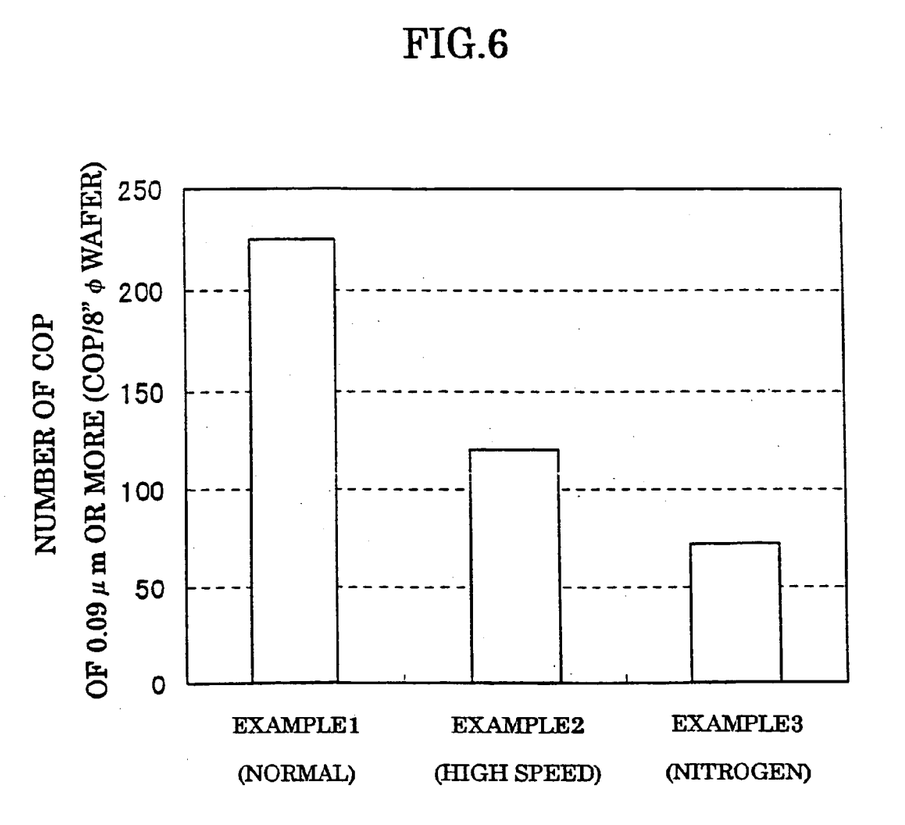
FIG. 6 is a graph showing number of COP on the surface of the wafer after heat treatment in Examples 1 to 3.

As shown in FIG. 6, the crystal containing the least COP was the wafer consisting of the crystal in which nitrogen was doped, and the number of COP gets large in the order of the above-mentioned wafer, the wafer pulled at high speed, and the wafer pulled at general speed. Accordingly, a bond wafer having less grown-in defects can be produced using the crystal pulled at high speed or the crystal in which nitrogen was doped. When the crystal was pulled at high speed, time for pulling crystal can be shorten, and thus throughput can be improved.

As for the bond wafers produced under three kinds of condition as described above, SOI wafers were produced by the same method as Example 1, and COP was evaluated. The results were shown in Table 2.

TABLE 2

| | Bond wafer | COP density (number/cm²) |
|---|---|---|
| Example 1 | General pulling rate no nitrogen was doped | 0.2 |
| Example 2 | High pulling rate no nitrogen was doped | 0.1 |
| Example 3 | General pulling rate nitrogen was doped | 0.01 |

As shown in Table 2, COP density of the SOI wafer produced using the silicon single crystal wafer consisting of crystal pulled at high speed was half of COP density of the SOI wafer produced using a general silicon single crystal wafer. COP density of the SOI wafer produced using the silicon single crystal wafer consisting of crystal in which nitrogen was doped was one twentieth of general one. Accordingly, the SOI wafer having further excellent SOI layer can be obtained using the crystal pulled at high speed or the crystal in which nitrogen was doped.

Example 4, Comparative Example 3, Comparative Example 4

The same silicon single crystal wafer as used in Example 1 was subjected to annealing in 100% Ar atmosphere at 1200° C. for 40 minutes, and subsequently to oxidation in atmosphere containing water vapor at 150° C. for 240 minutes to form an oxide film having a thickness of 1.0 µm. The bonded SOI wafer having SOI layer with thickness of 5 µm and BOX layer with thickness of 1 µm was produced according to a general grinding and polishing method using the wafers produced above as a bond wafer. Thickness of the oxide film was measured using MPV-SP manufactured by Leitz Corporation.

Oxide dielectric breakdown voltage was compared as for the SOI wafer produced above, the SOI wafer subjected to annealing of H₂/1200° C./one hour (Comparative Example 3) or the wafer subjected to annealing of Ar/1200° C./one hour (Comparative Example 4), then cooled to room temperature, and subsequently subjected to oxidation heating treatment (oxidation in atmosphere containing water vapor at 1150° C. for 240 minutes). Measurement condition was the same as Example 1.

Figure 7:
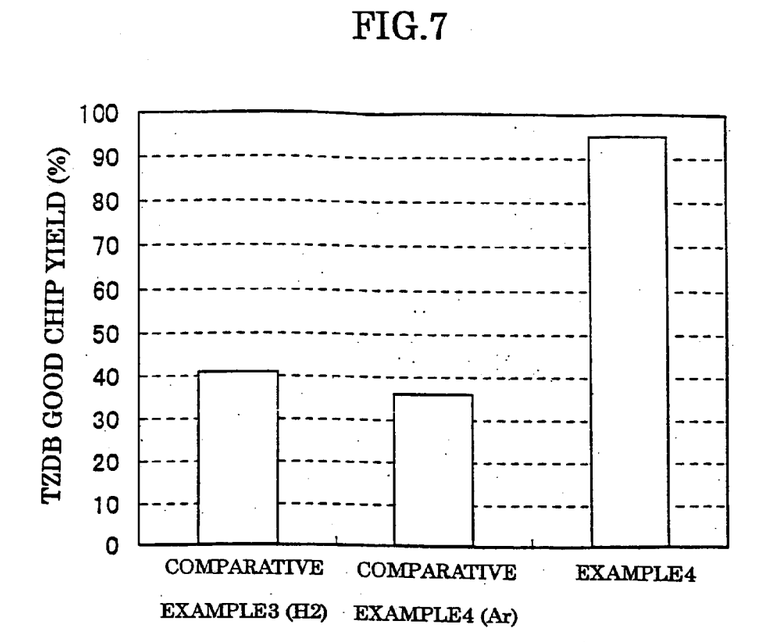
FIG. 7 is a graph showing TZDB good chip yield in the SOI wafer of Example 4.
Figure 8:
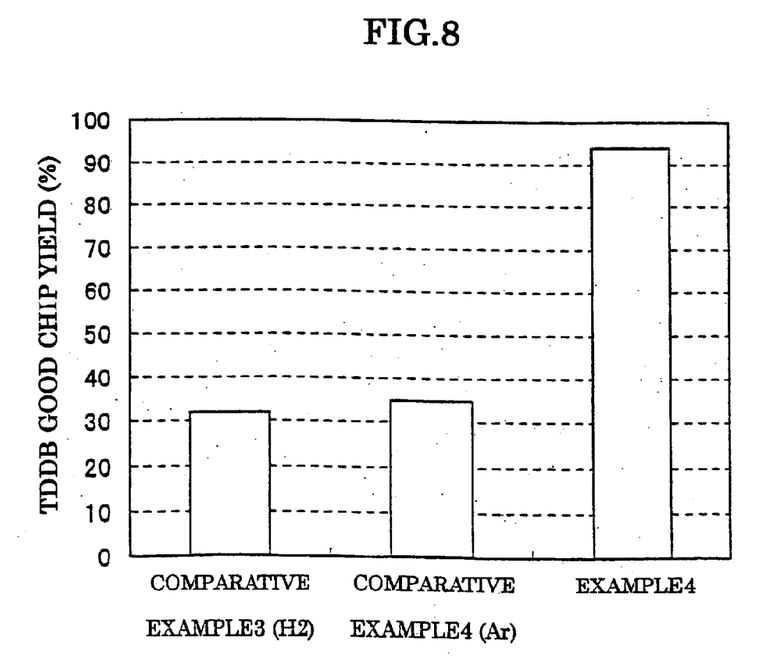
FIG. 8 is a graph showing TDDB good chip yield in the SOI wafer of Example 4.

The results were shown in FIG. 7 and FIG. 8. As shown in the results, the wafer subjected to the heat treatment of the present invention has excellent in TZDB and TDDB, even when the thickness of the SOI layer was more than 0.5 µm, namely has excellent in oxide dielectric breakdown voltage, whereas a conventional annealing method is not effective for the wafer having the SOI layer with the same thickness as above.

The present invention is not limited to the above-described embodiment. The above-described embodiment is a mere example, and those having the substantially same structure as that described in the appended claims and providing the similar action and effects are included in the scope of the present invention.

For example, when silicon single crystal ingot is grown according to Czochralski method whether nitrogen is doped or not, a magnetic field may be applied to a melt or not. Namely, the term "a Czochralski method" includes not only general Czochralski method but also MCZ method.

Furthermore, heat treatment at high temperature in non-oxidizing atmosphere and heat treatment in oxidizing atmosphere that is essential feature of the present invention can be applied to any steps in processing of a wafer. For example, it can be applied after chemical etching step after cutting a wafer, or after rough polishing step that is following to the above step, or after the final polishing step or the like.

As for the heat treatment in non-oxidizing gas atmosphere in the present invention, explanation in the above embodiment of the present invention has focused on the case that argon or nitrogen is used. However, atmosphere is not limited to argon and nitrogen, there can be used the above-gas containing hydrogen in an amount less than explosion limit, rare gas having the same effect as argon, such as helium, neon, krypton, xenon can be used, and are included in the scope of the present invention.

What is claimed is:

1. A method of producing a bonded SOI wafer comprising bonding a bond wafer and a base wafer via an oxide film and then reducing thickness of the bond wafer, wherein a silicon single crystal ingot is grown according to Czochralski method, the single crystal ingot is then sliced to produce a silicon single crystal wafer, the silicon single crystal wafer is subjected to heat treatment in a non-oxidizing atmosphere at a temperature of 1100° C. to 1300° C. for one minute or more and continuously to a heat treatment in an oxidizing atmosphere at a temperature of 700° C. to 1300° C. for one minute or more without cooling the wafer to a temperature less than 700° C. to provide a silicon single crystal wafer wherein a silicon oxide film is formed on the surface, and the resultant wafer is used as the bond wafer.

2. The method of producing the bonded SOI wafer according to claim 1 wherein the non-oxidizing atmosphere is argon, nitrogen or a mixed gas of argon and nitrogen.

3. The method of producing the bonded SOI wafer according to claim 1 wherein the oxidizing atmosphere is atmosphere containing water vapor.

4. The method of producing the bonded SOI wafer according to claim 1 wherein the oxidizing atmosphere is dry oxygen atmosphere or a mixed gas atmosphere of dry oxygen and argon or nitrogen.

5. The method of producing the bonded SOI wafer according to claim 4 wherein thickness of the oxide film formed by the heat treatment in the oxidizing atmosphere is 20 to 100 nm.

6. The method of producing the bonded SOI wafer according to claim 1 wherein thickness of the oxide film formed by the heat treatment in the oxidizing atmosphere is 20 to 100 nm.

7. The method of producing the bonded SOI wafer according to claim 1 wherein the oxide film is previously formed on the surface of the wafer before the heat treatment in a non-oxidizing atmosphere.

8. The method of producing the bonded SOI wafer according to claim 7 wherein thickness of the thermal oxide film on the surface of the wafer after the above-mentioned heat treatment in the oxidizing atmosphere is 300 nm or more.

9. The method of producing the bonded SOI wafer according to claim 1 wherein a silicon single crystal ingot is grown according to Czochralski method with controlling a cooling rate at 1150° C. to 1080° C. of the single crystal ingot to be 2.3° C./min or more.

10. The method of producing the bonded SOI wafer according to claim 1 wherein a silicon single crystal ingot in which nitrogen is doped is grown according to Czochralski method.

11. The method of producing the bonded SOI wafer according to claim 10 wherein silicon single crystal ingot in which nitrogen is doped according to Czochralski method, and the concentration of nitrogen doped in the single crystal ingot is $1\times10^{10}$ to $5\times10^{15}$ atoms/cm$^3$.

12. The method of producing the bonded SOI wafer according to claim 1 wherein the concentration of oxygen contained in the single crystal ingot is 18 ppma or less.

13. A bonded SOI wafer produced by the method according to claim 1.

14. A method of producing a bonded SOI wafer comprising bonding a bond wafer and a base wafer via an oxide film and then reducing thickness of the bond wafer, wherein a silicon single crystal ingot is grown according to Czochralski method, the single crystal ingot is then sliced to produce a silicon single crystal wafer, the silicon single crystal wafer is subjected to heat treatment in a non-oxidizing atmosphere at a temperature of 1100° C. to 1300° C. for one minute or more and continuously to a heat treatment in an oxidizing atmosphere at a temperature of 700° C. to 1300° C. for one minute or more without cooling the wafer to a temperature less than 700° C. to provide a silicon single crystal wafer wherein a silicon oxide film is formed on the surface, at least one of hydrogen ions and rare gas ions are implanted into the surface via a silicon oxide film of the wafer to form an ion implanted layer, and the resultant wafer is used as the bond wafer, which is then brought into close contact with the base wafer via the silicon oxide film of the bond wafer, followed by delamination at the ion implanted layer by heat treatment.

15. A method of producing the bonded SOI wafer wherein the bond wafer delaminated at the ion implanted layer in the method of producing a bonded SOI wafer described in claim 14 is used as a new bond wafer.

16. A method of producing the bonded SOI wafer wherein the bond wafer delaminated at the ion implanted layer in the method of producing a bonded SOI wafer described in claim 14 is used as a new base wafer.

17. The method of producing the bonded SOI wafer according to claim 14 wherein the non-oxidizing atmosphere is argon, nitrogen or a mixed gas of argon and nitrogen.

18. The method of producing the bonded SOI wafer according to claim 14 wherein the oxidizing atmosphere is atmosphere containing water vapor.

19. The method of producing the bonded SOI wafer according to claim 14 wherein the oxidizing atmosphere is dry oxygen atmosphere or a mixed gas atmosphere of dry oxygen and argon or nitrogen.

20. The method of producing the bonded SOI wafer according to claim 19 wherein thickness of the oxide film formed by the heat treatment in the oxidizing atmosphere is 20 to 100 nm.

21. The method of producing the bonded SOI wafer according to claim 14 wherein thickness of the oxide film formed by the heat treatment in the oxidizing atmosphere is 20 to 100 nm.

22. The method of producing the bonded SOI wafer according to claim 14 wherein the oxide film is previously formed on the surface of the wafer before the heat treatment in a non-oxidizing atmosphere.

23. The method of producing the bonded SOI wafer according to claim 22 wherein thickness of the thermal oxide film on the surface of the wafer after the above-mentioned heat treatment in the oxidizing atmosphere is 300 nm or more.

24. The method of producing the bonded SOI wafer according to claim 14 wherein a silicon single crystal ingot is grown according to Czochralski method with controlling a cooling rate at 1150° C. to 1080° C. of the single crystal ingot to be 2.3° C./min or more.

25. The method of producing the bonded SOI wafer according to claim 14 wherein a silicon single crystal ingot in which nitrogen is doped is grown according to Czochralski method.

26. The method of producing the bonded SOI wafer according to claim 25 wherein silicon single crystal ingot in which nitrogen is doped according to Czochralski method, and the concentration of nitrogen doped in the single crystal ingot is $1\times10^{10}$ to $5\times10^{15}$ atoms/cm$^3$.

27. The method of producing the bonded SOI wafer according to claim 14 wherein the concentration of oxygen contained in the single crystal ingot is 18 ppma or less.

28. A bonded SOI wafer produced by the method according to claim 14.

* * * * *